(12) United States Patent
Takahashi et al.

(10) Patent No.: US 7,714,683 B2
(45) Date of Patent: May 11, 2010

(54) INDUCTANCE DEVICE, FILTER DEVICE COMPRISING THE SAME, AND NOISE FILTER COMPRISING THE SAME

(75) Inventors: Masahiko Takahashi, Sendai (JP); Hiroshi Ono, Sendai (JP); Satoshi Arai, Sendai (JP); Teruhiko Fujiwara, Sendai (JP)

(73) Assignee: NEC TOKIN Corporation, Sendai-shi (JP)

( * ) Notice: Subject to any disclaimer, the term of this patent is extended or adjusted under 35 U.S.C. 154(b) by 0 days.

(21) Appl. No.: 11/973,610

(22) Filed: Oct. 9, 2007

(65) Prior Publication Data
US 2008/0084254 A1    Apr. 10, 2008

(30) Foreign Application Priority Data
Oct. 10, 2006 (JP) .............................. 2006-276882
Jul. 24, 2007 (JP) .............................. 2007-192344

(51) Int. Cl.
*H03H 7/00* (2006.01)
*H01F 29/00* (2006.01)

(52) U.S. Cl. .................... 333/181; 333/177; 336/69; 336/110; 336/177; 336/229

(58) Field of Classification Search ................. 333/177, 333/181, 15, 69, 110, 219, 221, 222, 229
See application file for complete search history.

(56) References Cited

U.S. PATENT DOCUMENTS

| 2,238,915 | A | | 4/1941 | Peters et al. | |
|---|---|---|---|---|---|
| RE24,813 | E | * | 4/1960 | Nordin | 333/163 |
| 4,368,407 | A | * | 1/1983 | Wroblewski | 315/291 |
| 4,945,322 | A | * | 7/1990 | Okumura | 333/184 |
| 5,040,094 | A | * | 8/1991 | Okumura | 361/330 |
| 5,153,812 | A | * | 10/1992 | Naito | 361/270 |
| 5,367,275 | A | * | 11/1994 | Esaki et al. | 333/184 |
| 5,838,214 | A | * | 11/1998 | Goel et al. | 333/177 |
| 6,693,505 | B2 | * | 2/2004 | Bock | 336/69 |

FOREIGN PATENT DOCUMENTS

| GB | 453538 A | 9/1936 |
|---|---|---|
| GB | 519506 A | 3/1940 |

(Continued)

OTHER PUBLICATIONS

A partial European Search Report dated Jan. 29, 2008, issued in a counterpart European Application.

(Continued)

*Primary Examiner*—Robert Pascal
*Assistant Examiner*—Kimberly E Glenn
(74) *Attorney, Agent, or Firm*—Frishauf, Holtz, Goodman & Chick, P.C.

(57) ABSTRACT

An inductance device comprises a magnetic core, a coil a conductor and a dielectric member. The coil is made of turns of insulated conductive wire. The conductor is distinct from the coil and is insulated from the magnetic core. The dielectric member is disposed between the conductor and the coil. The dielectric member, the conductor and the coil constitute a capacitor. The inductance device is used in, for example, a filter device or a noise filter.

34 Claims, 18 Drawing Sheets

FOREIGN PATENT DOCUMENTS

| | | | |
|---|---|---|---|
| GB | 2 250 392 | A | 6/1992 |
| JP | 1997-102426 | A | 4/1997 |
| JP | 2004-235709 | A | 8/2004 |
| JP | 2004-311866 | A | 11/2004 |

OTHER PUBLICATIONS

European Office Action dated Sep. 24, 2009 and English translation thereof issued in a counterpart—Application No. 07019753.8.

* cited by examiner

INDUCTANCE DEVICE, FILTER DEVICE COMPRISING THE SAME, AND NOISE FILTER COMPRISING THE SAME

BACKGROUND OF THE INVENTION

This invention relates to an inductance device which is used in for example a noise filter for an alternating current (AC) line.

When an inductance device is used in high frequency region, inter-wire capacitance of the coil might have a detrimental effect on noise filtering property of the inductance device. To suppress the inter-wire capacitance effect, JP 1997-102426 A, JP 2004-311866 A or JP 2004-235709 A has proposed a magnetic core that is grounded, those documents being incorporated herein by reference.

However, the grounding of the magnetic core decreases design flexibility of the inductance device.

SUMMARY OF THE INVENTION

It is therefore an object of the present invention to provide an inductance device that can suppress the inter-wire capacitance effect without using a grounded magnetic core.

According to one aspect of the present invention, an inductance device comprises a magnetic core, a coil, a conductor and a dielectric member. The coil is made of turns of insulated conductive wire. The conductor is distinct from the coil and is insulated from the magnetic core. The dielectric member is disposed between the conductor and the coil. The dielectric member, the conductor and the coil constitute a capacitor. The inductance device is used in, for example, a filter device or a noise filter.

An appreciation of the objectives of the present invention and a more complete understanding of its structure may be had by studying the following description of the preferred embodiment and by referring to the accompanying drawings.

Figure 1:
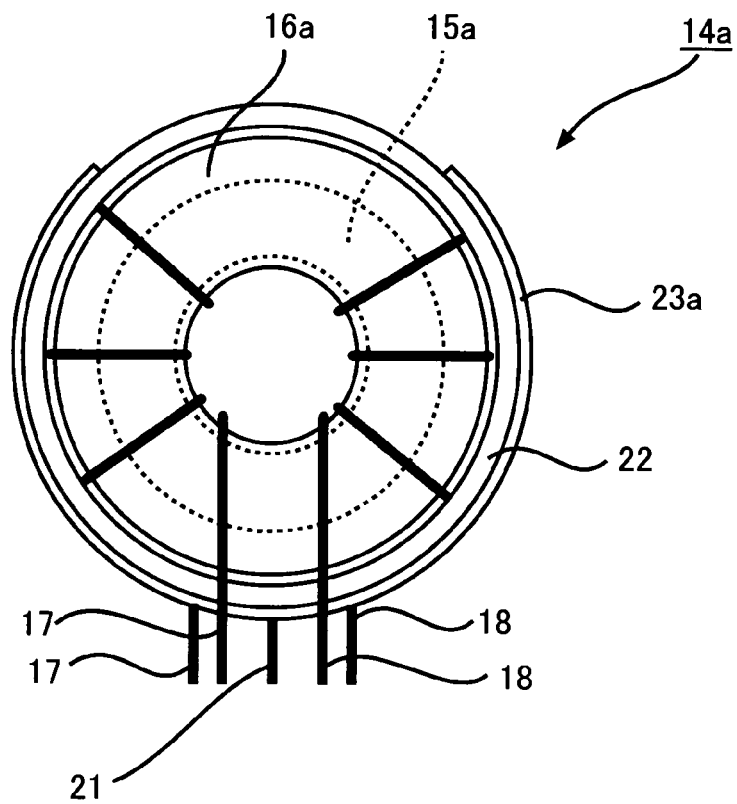
FIG. 1 is a plan view showing an inductance device in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Figure 2:
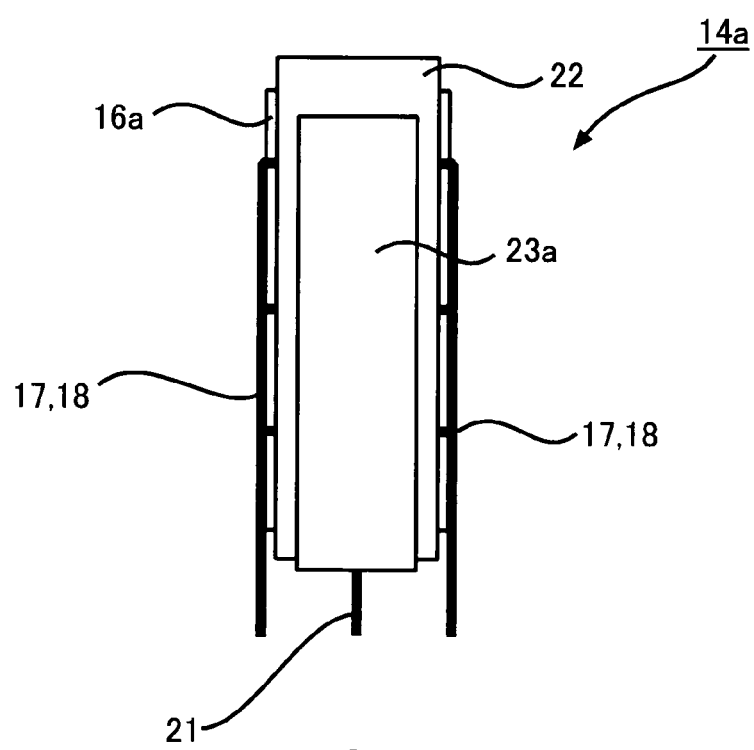
FIG. 2 is a side view showing the inductance device of FIG. 1.
Figure 3:
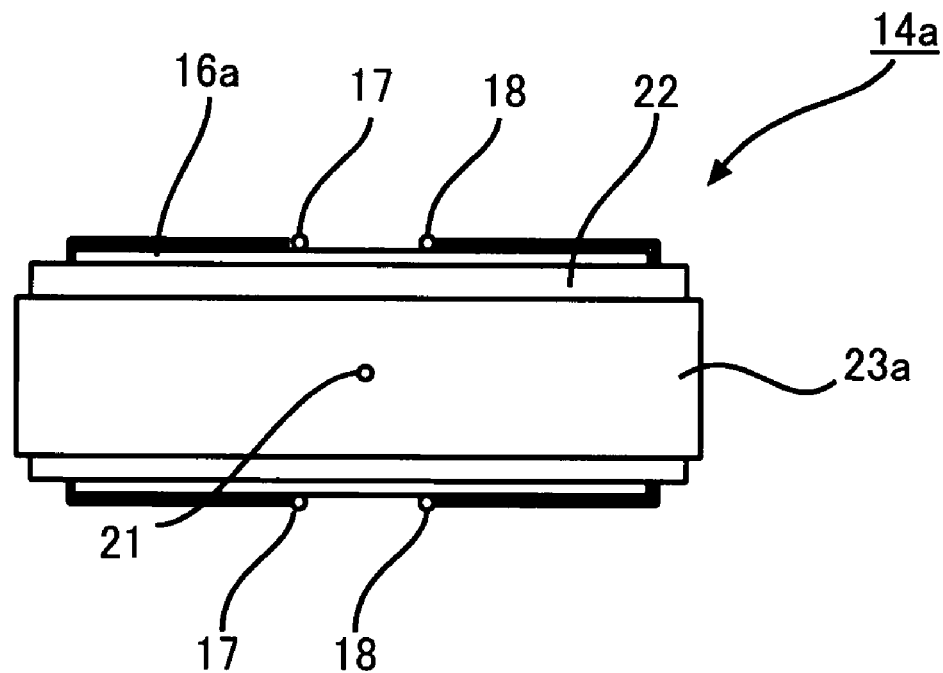
FIG. 3 is a bottom view showing the inductance device of FIG. 1.

Referring to FIGS. 1 to 3, an inductance device 14a according to a first embodiment of the present invention is for common mode and therefore comprises two insulated conductive wires 17 and 18. However, the present invention is not limited thereto. An inductance device may comprise only one insulated conductive wire and may be used for normal mode.

In detail, the illustrated inductance device 14a comprises a magnetic core 15a, a toroidal insulator 16a having a toroidal shape, coils made of turns of insulated conductive wires 17 and 18 are wound on the toroidal insulator 16a, a conductor 23a, a dielectric member 22 disposed between the conductor 23a and the coils, and a ground terminal 21 connected to the conductor 23a.

As shown in FIG. 1, the magnetic core 15a has a toroidal shape. The toroidal insulator 16a encloses the magnetic core 15a. The insulated conductive wires 17 and 18 are wound on the toroidal insulator 16a.

The dielectric member 22 has a ring-like or annular shape and encircles circumferences of the coils. The dielectric member 22 is disposed between the conductor 23a and the coils so that the dielectric member 22, the conductor 23a and the coils constitute a capacitor.

The toroidal insulator 16a, the coils, and the dielectric member 22 are disposed between the magnetic core 15a and the conductor 23a so that the conductor 23a is insulated from the magnetic core 15a.

The magnetic core 15a of this embodiment is made of a magnetic material having an initial magnetic permeability of about 10000. On the contrary, the general magnetic material has the initial magnetic permeability of about 5000. In other words, the magnetic core of this embodiment has the magnetic permeability twice as the general magnetic core. The magnetic material having the high magnetic permeability allows to minify the size of the magnetic core without degrading attenuation characteristic. Unless a primary object is to downsize the magnetic core, the magnetic core made of the general magnetic material can be used.

The insulated conductive wires 17 and 18 are made of, for example, urethane wires or enamel wires. Referring to FIG. 3, leading portions of the insulated conductive wires 17 and 18 are pulled out from the coil at the symmetrical positions; however, they are illustrated differently in FIG. 1 for the purpose of facilitating the understanding of the structure.

In this embodiment, the dielectric member 22 has the toroidal shape with a predetermined thickness; however, the dielectric member 22 may have various other shapes such as a partially cut-off C shape. The dielectric member 22 may include an insulator sheet or tape having two surfaces. One of the two surfaces may be formed with an adhesive layer so that the insulator sheet or tape may be adhered to the circumference surfaces of the coils. The insulator sheet may be adhered to the circumferential surfaces of the coils by the use of an adhesive agent. In addition, the dielectric member 22 may comprise a silicone sheet or a fluoride resin sheet.

The conductor 23a is formed on the dielectric member 22 so that the dielectric member 22 is positioned between the conductor 23a and the wires 17 and 18 of the coils. The conductor 23a may be formed on the various positions with various dimensions; its position and/or its dimensions depend on the number of turns, the thicknesses and the lengths of the insulated conductive wires 17 and 18, the size of the magnetic core, or characteristics of the materials of the magnetic core.

In this embodiment, the conductor 23a is a thin film conductor and is formed by sputtering copper on a part of the circumferential surface of the dielectric member 22. Alternative to copper foil, the conductor 23a may be made of an aluminum foil, a silver foil, or a gold foil, or an alloy foil containing any one of aluminum, silver, or gold. The conductor 23a may be obtained by exposing the dielectric member 22 to a metal plating process, a metal deposition process, or by applying conductive paint coating on the circumferential surface of the dielectric member 22. Moreover, the conductor 23a may be formed by a separate manufacturing process and may be stacked on the dielectric member 22. The conductor 23a may encircle the entire outer surface of the dielectric member 22. Other conductive materials having various other shapes may be used as the conductor unless the conductor and the insulated conductive wires constitute a capacitor having a large capacitance.

Figure 4:
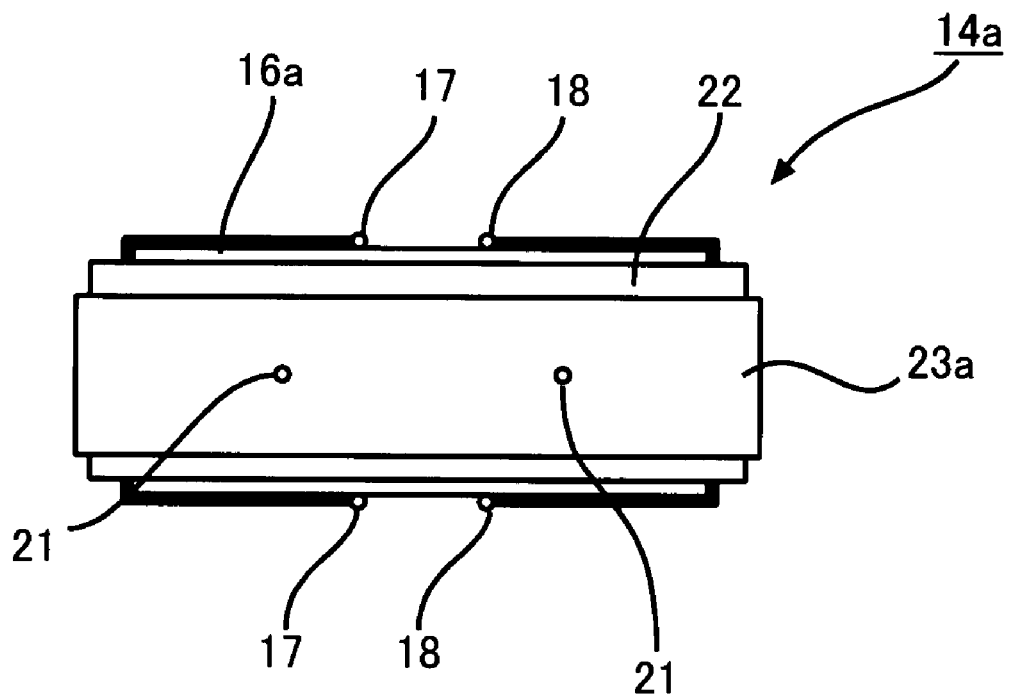
FIG. 4 is a bottom view showing a modification of the inductance device of FIG. 3.

As shown in FIGS. 1 to 3, the ground terminal 21 is provided at the position equally apart from the leading portions of the insulated conductive wires 17 and 18. However, as shown in FIG. 4, the inductance device 14a may have two ground terminals separately extending from the conductor 23a. In that case, a distance between the ground terminals may be longer than the distance between the insulated conductive wires 17 or 18.

With the above-described structure, a good attenuating characteristic can be achieved in a wide frequency range.

In this embodiment, the conductor 23a is provided on the outermost surface of the magnetic core 15a in a radial direction. Therefore, the dimension of the conductor 23a may be larger than that of the outer surface of the magnetic core 15a. With this structure, a larger capacitance is added to the insulated conductive wires 17 and 18 as compared with the earlier technique in which magnetic core is directly grounded.

Second Embodiment

Figure 5:
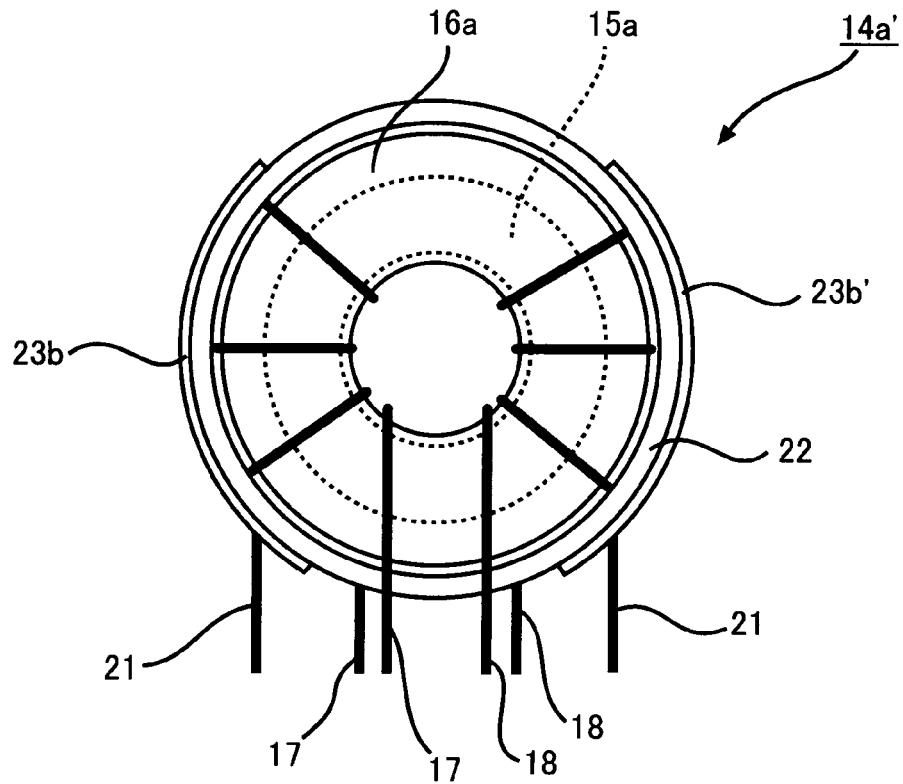
FIG. 5 is a plan view showing an inductance device in accordance with a second embodiment of the present invention.
Figure 6:
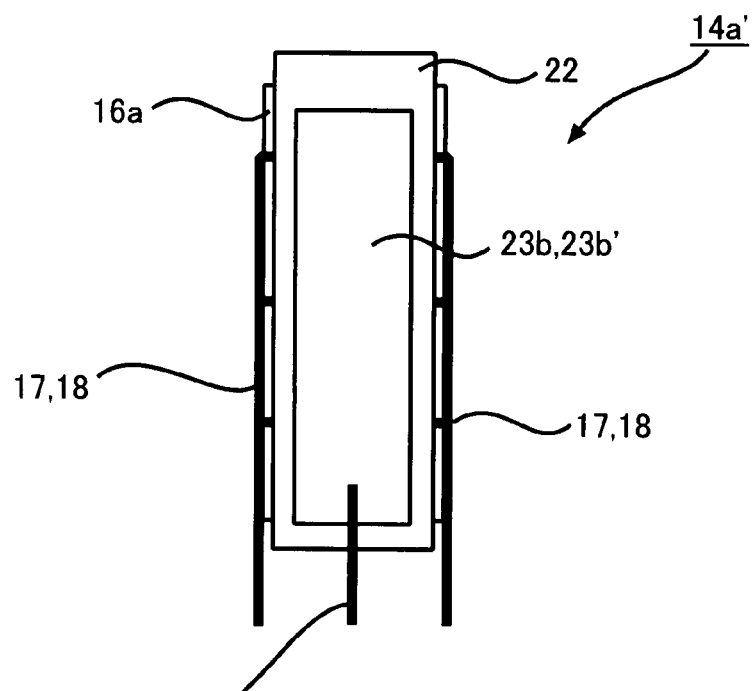
FIG. 6 is a side view showing the inductance device of FIG. 5.
Figure 7:
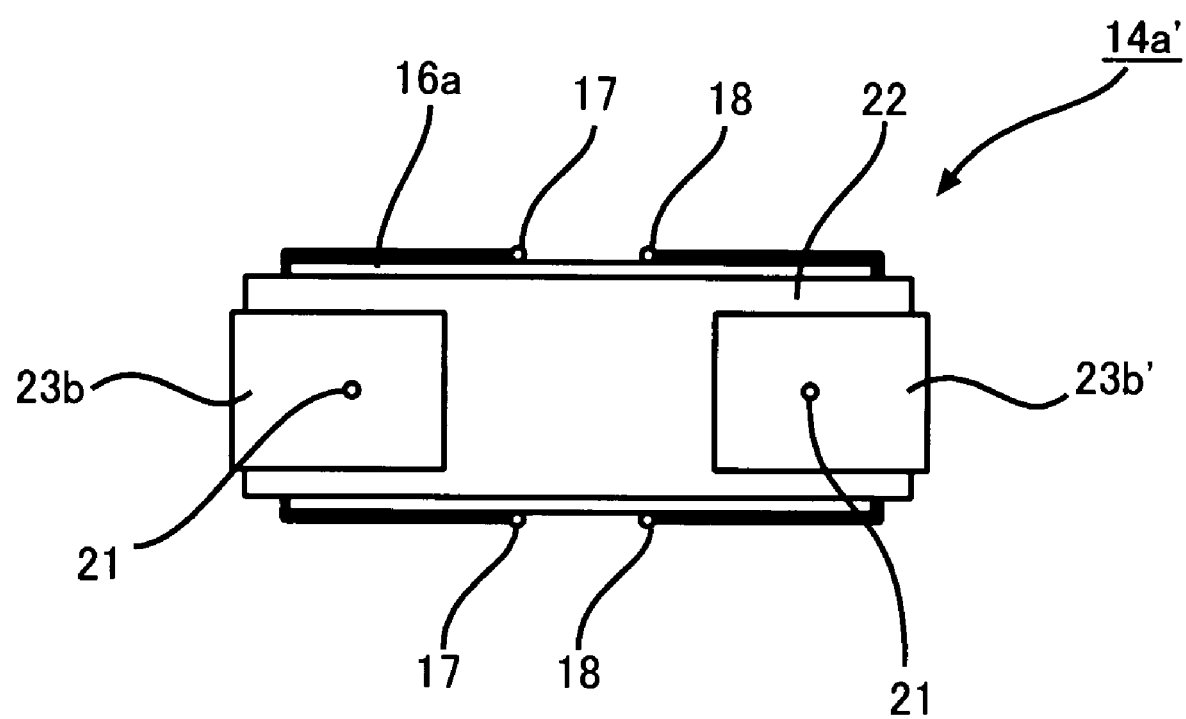
FIG. 7 is a bottom view showing the inductance device of FIG. 5.

Referring to FIGS. 5 to 7, the inductance device 14a' according to a second embodiment of the present invention is a modified example of the first embodiment. Therefore, in FIGS. 5 to 7, the same reference numbers are given to the structures same as those illustrated in FIGS. 1 to 3 and the description therefore will be omitted.

In FIGS. 5 to 7, the inductance device 14a' of this embodiment has two conductors 23b and 23b'. A pair of the conductors 23b and 23b' are provided over the insulated conductive wires 17 and 18 with the dielectric member 22 positioned between the conductors 23b and 23b' and the coils. Each of the conductors 23b and 23b' is provided with the ground terminal 21.

Third Embodiment

Figure 8:
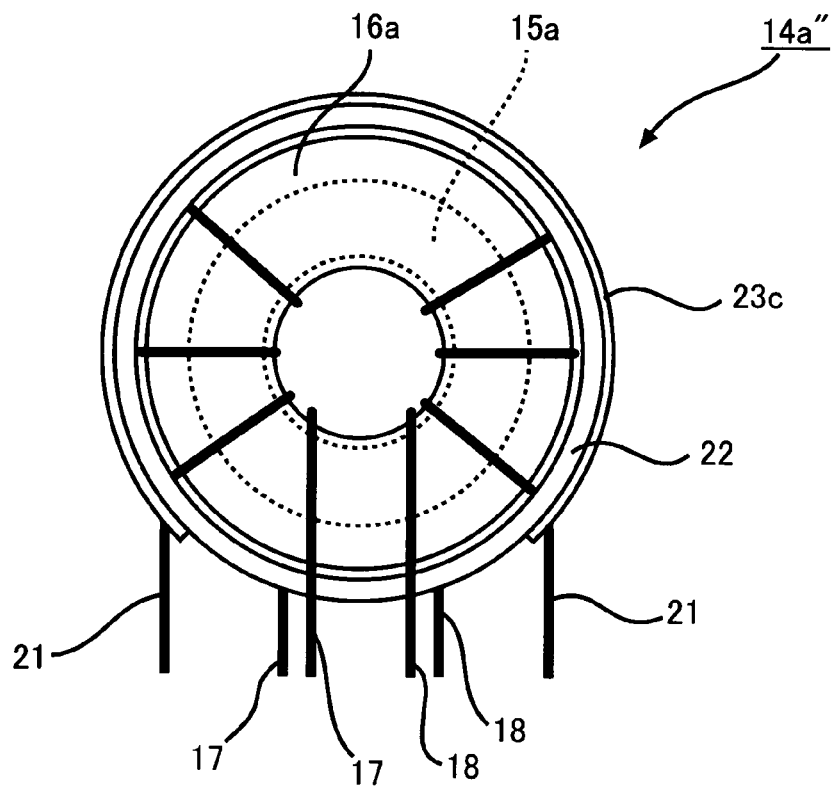
FIG. 8 is a plan view showing an inductance device in accordance with a third embodiment of the present invention.
Figure 9:
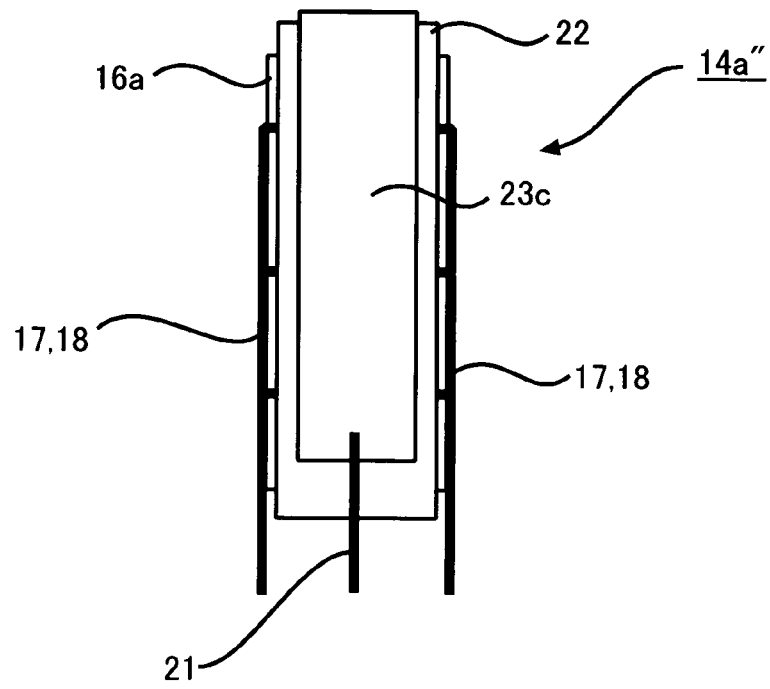
FIG. 9 is a side view showing the inductance device of FIG. 8.
Figure 10:
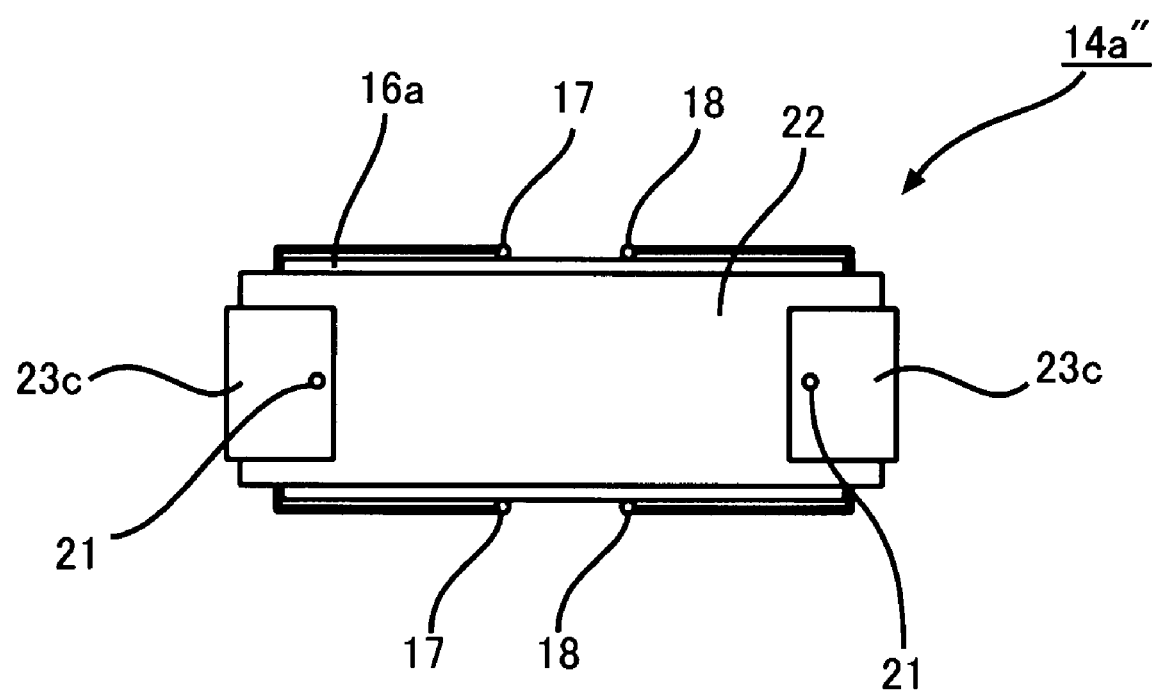
FIG. 10 is a bottom view showing the inductance device of FIG. 8.

Referring to FIGS. 8 to 10, the inductance device 14a" according to a third embodiment of the present invention is a modified example of the first embodiment. Therefore, in FIGS. 8 to 10, the same reference numbers are given to the structures same as those illustrated in FIGS. 1 to 3 and the description therefore will be omitted.

As shown in FIGS. 8 to 10, the inductance device 14a" of this embodiment is provided with a conductor 23c which surrounds the circumferential surface of the dielectric member 22 except for the portions around the leading portions of the insulated conductive wires 17 and 18. The inductance device 14a" is provided with two ground terminals 21.

Fourth Embodiment

Referring to FIGS. 11 to 14, a fourth embodiment of the present invention is a modified example of the first embodiment. Therefore, in FIGS. 11 to 14, the same reference numbers are given to the structures same as those illustrated in FIGS. 1 to 3 and the description therefore will be omitted.

The inductance device 14b of this embodiment comprises a magnetic core 15b, a toroidal insulator 16b having a toroidal shape, a conductor 23d, the dielectric member 22, the ground terminal 21 connected to the conductor 23d, and the coils made of turns of insulated conductive wires 17 and 18.

The magnetic core 15b has a toroidal shape. The toroidal insulator 16b encloses the magnetic core 15b. The conductor 23d is a thin film conductor and has a partially cut-off C shape. The conductor 23d is disposed on a part of the circumferential surface of the toroidal insulator 16b. The dielectric member 22 has a ring-like or annular shape and is disposed on the circumferential surface of the conductor 23d so that the conductor 23d is disposed between the dielectric member 22 and the toroidal insulator 16b.

The insulated conductive wires 17 and 18 are wound on the magnetic core 15b, the conductor 23d, and the dielectric member 22 in part.

The ground terminal 21 is pulled out from the conductor 23d via a through-hole formed in the dielectric member 22.

The dielectric member 22 is disposed between the conductor 23a and the coils so that the dielectric member 22, the conductor 23a and the coil constitute a capacitor.

A part of the toroidal insulator 16b exists between the magnetic core 15b and the conductor 23d so that the conductor 23d is insulated from the magnetic core 15b.

Figure 11:
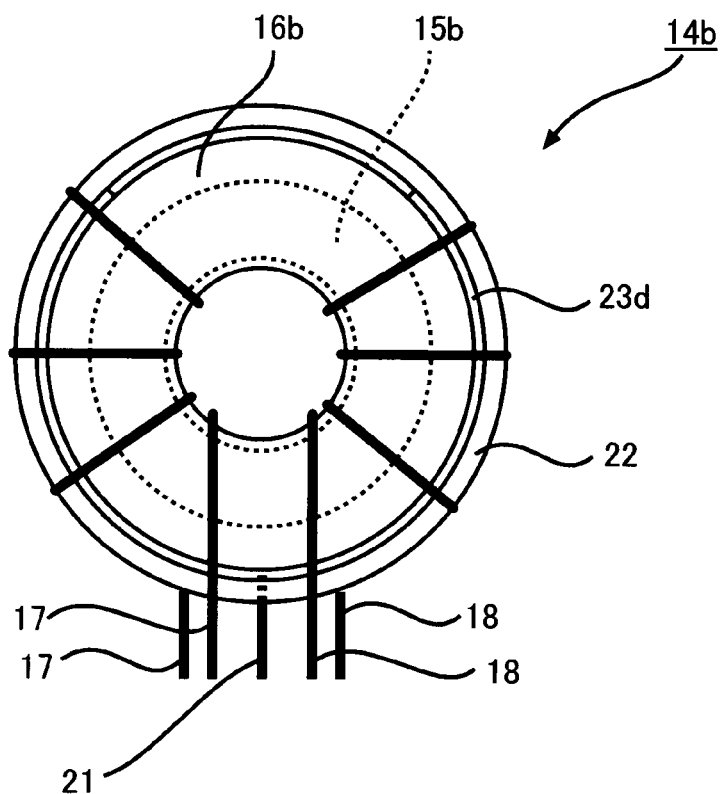
FIG. 11 is a plan view showing an inductance device in accordance with a fourth embodiment of the present invention.
Figure 12:
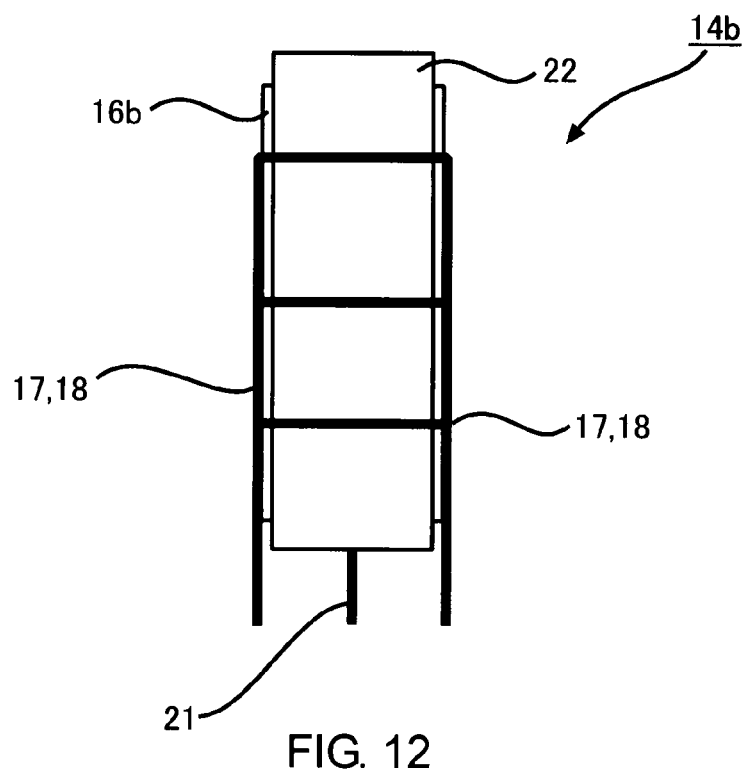
FIG. 12 is a side view showing the inductance device of FIG. 11.
Figure 13:
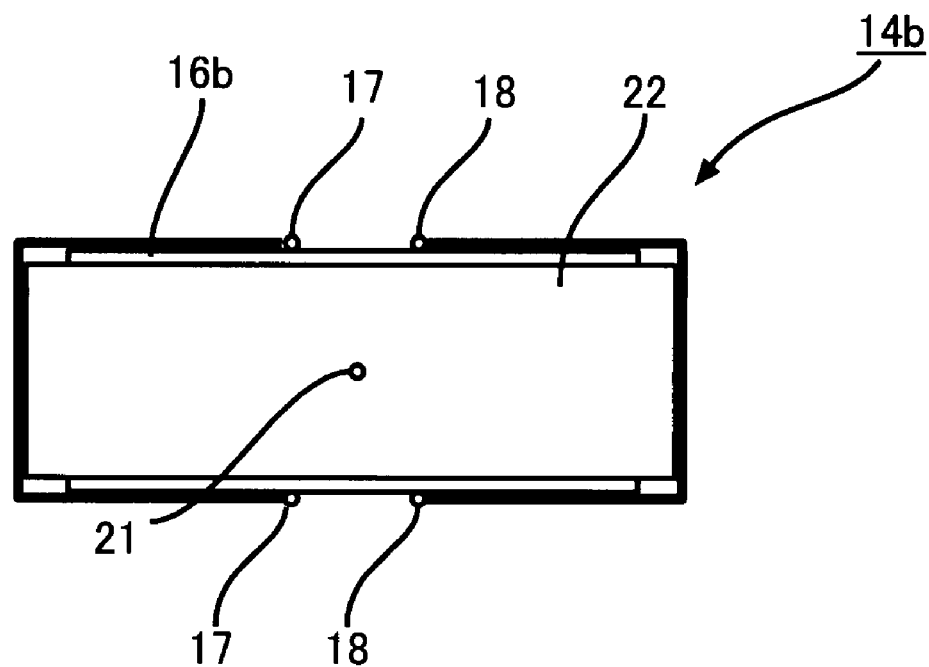
FIG. 13 is a bottom view showing the inductance device of FIG. 11.
Figure 14:
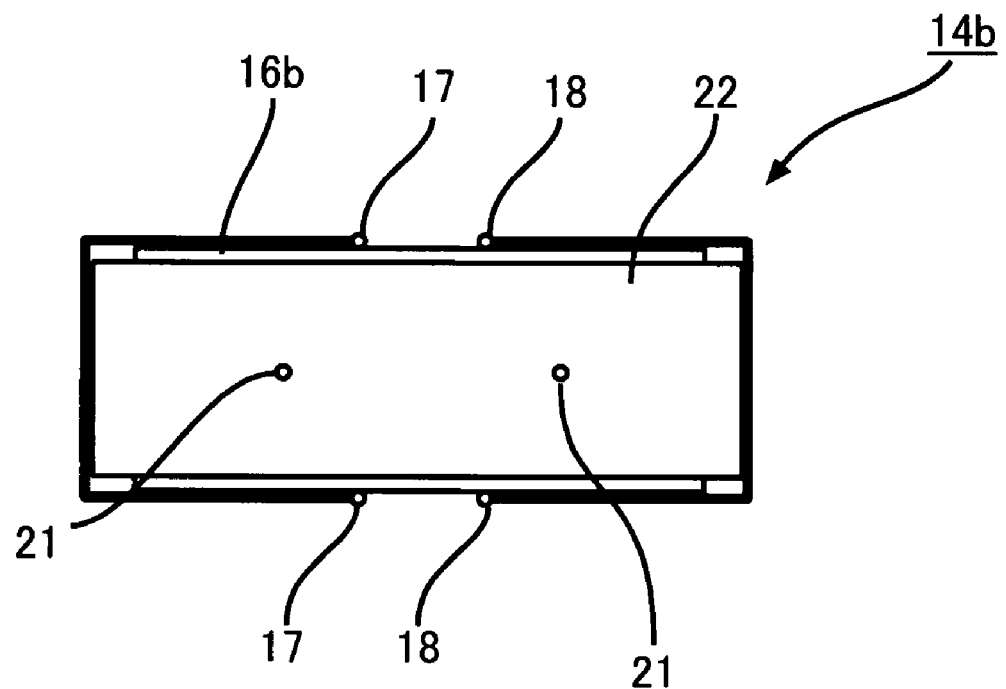
FIG. 14 is a bottom view showing a modification of the inductance device of FIG. 13.

As shown in FIGS. 11 to 13, the ground terminal 21 is provided at the position equally apart from the leading portions of the insulated conductive wires 17 and 18. However, as shown in FIG. 14, the inductance device 14b may have two ground terminals separately extending from the conductor 23d. In that case, a distance between the ground terminals may be longer than the distance between the insulated conductive wires 17 or 18.

Fifth Embodiment

Referring to FIGS. 15 to 18, a fifth embodiment of the present invention is a modified example of the first embodiment. Therefore, in FIGS. 15 to 18, the same reference numbers are given to the structures same as those illustrated in FIGS. 1 to 3 and the description therefore will be omitted.

An inductance device 14c of this embodiment comprises a magnetic core 15c, a conductor 24a, a dielectric member 16c, the ground terminal 21, and the coils made of turns of insulated conductive wires 17 and 18.

The magnetic core 15c has a toroidal shape. The conductor 24a is a thin film conductor and has a partially cut-off C shape. The dielectric member 16c is a molded insulator and has a toroidal shape. The dielectric member 16c encloses the magnetic core 15c and the conductor 24a. The insulated conductive wires 17 and 18 are wound on the dielectric member 16c. The ground terminal 21 is pulled out from the conductor 24a via a through-hole formed in the dielectric member 16c.

Figure 18:
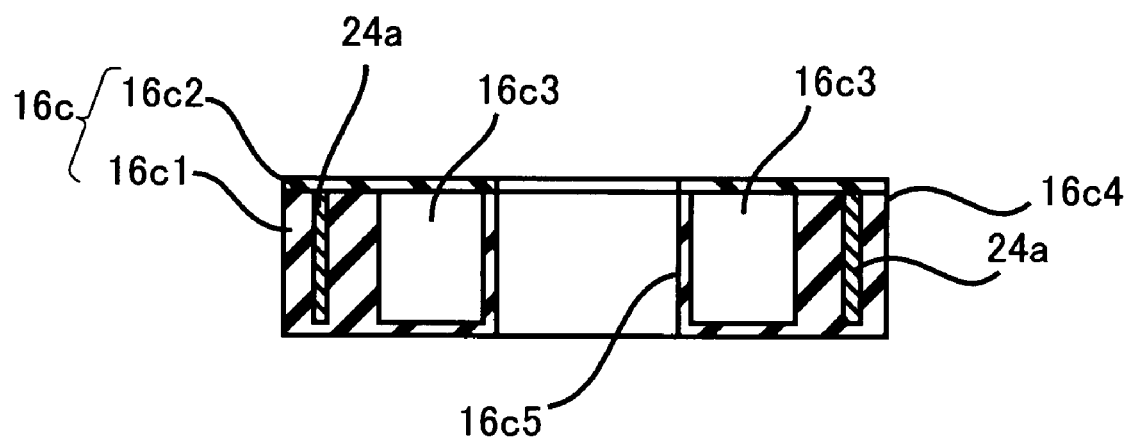
FIG. 18 is a cross-sectional view showing a dielectric member and a conductor included in the inductance device of FIG. 15.
Figure 19:
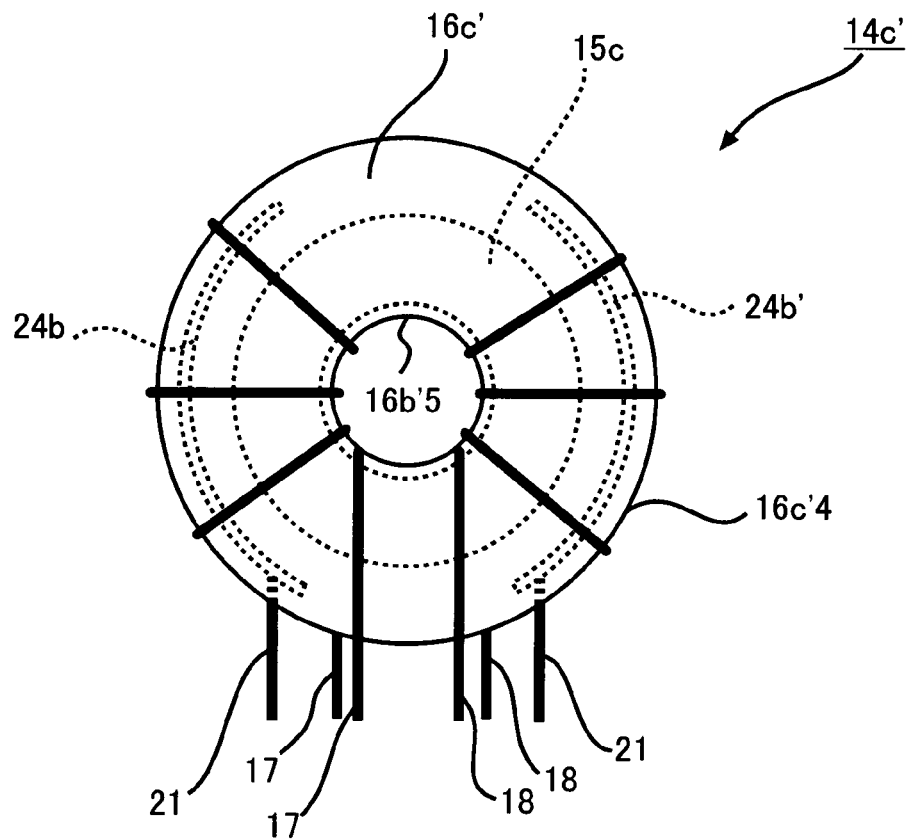
FIG. 19 is a plan view showing an inductance device in accordance with a sixth embodiment of the present invention.
Figure 20:
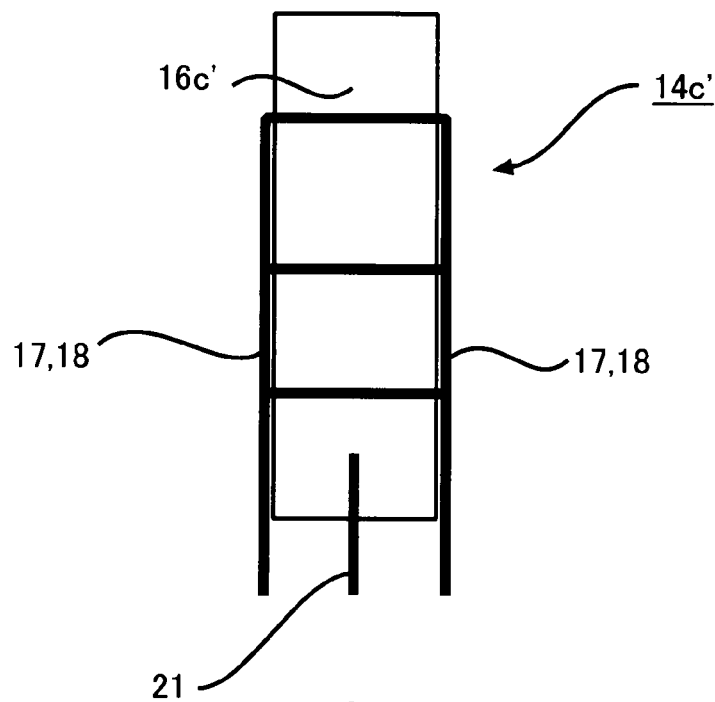
FIG. 20 is a side view showing the inductance device of FIG. 19.
Figure 21:
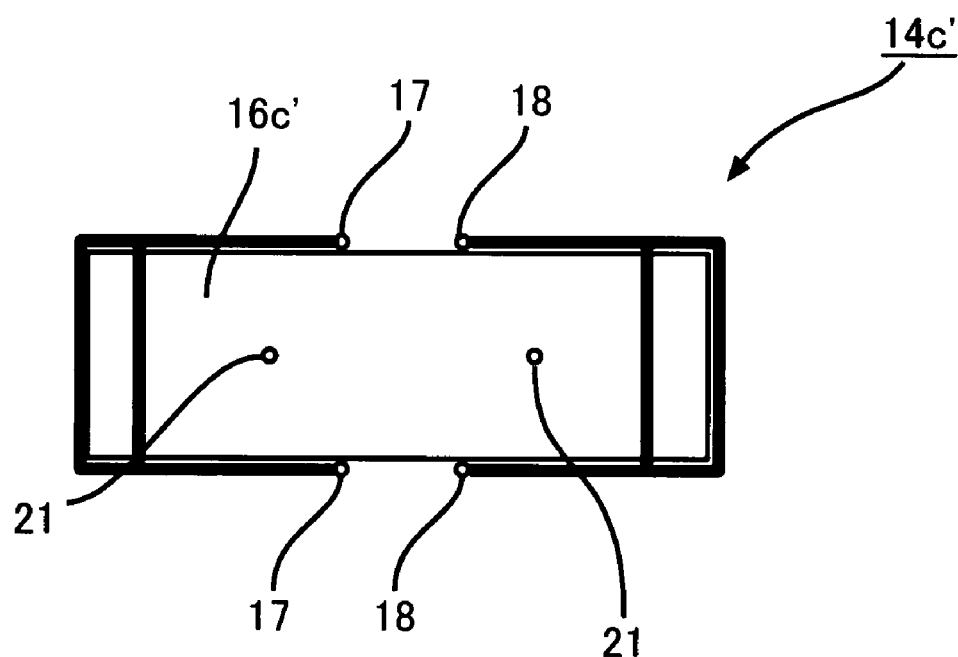
FIG. 21 is a bottom view showing the inductance device of FIG. 19.

As shown in FIG. 18, the dielectric member 16c of this embodiment comprises a base portion 16c1 and a lid portion 16c2 covering the base portion 16c1. In the base portion 16c1, an accommodation portion 16c3 is formed. The base portion 16c1 has an outer ring-shaped surface 16c4 and an inner ring-shaped surface 16c5. In this embodiment, the accommodation portion 16c3 is a recessed portion having a toroidal shape and is provided near the inner ring-shaped surface 16c5. The dielectric member 16c holds the magnetic core 15c in the accommodation portion 16c3. The conductor 24a is embedded in the dielectric member 16c and is positioned between the magnetic core 15c and the outer ring-shaped surface 16c4. The conductor 24a and the magnetic core 15c are separated from each other.

The dielectric member 16c is disposed between the conductor 24a and the coils so that the dielectric member 16c, the conductor 24a and the coils constitute a capacitor.

A part of the dielectric member 16c exists between the magnetic core 15c and the conductor 24a so that the magnetic core 15c is insulated from the conductor 24a.

The conductor 24a is provided nearer the outer ring-shaped surface 16c4 than the magnetic core 15c in the radial direction so that the dimension of the conductor 24a may be larger than the magnetic core 15c. With this structure, a larger capacitance may be added to the insulated conductive wires 17 and 18. The conductor 24a may be formed on the various positions with various dimension; its position and/or its dimensions depend on the number of turns, the thicknesses and the lengths of the insulated conductive wires 17 and 18, the size of the magnetic core, or characteristics of the materials of the magnetic core.

Figure 15:
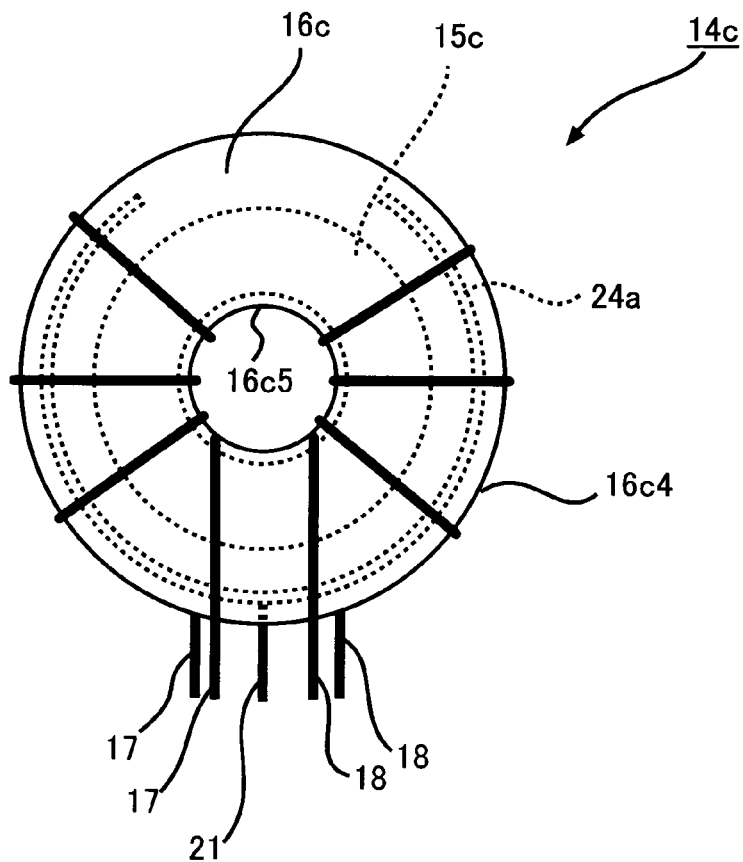
FIG. 15 is a plan view showing an inductance device in accordance with a fifth embodiment of the present invention.
Figure 16:
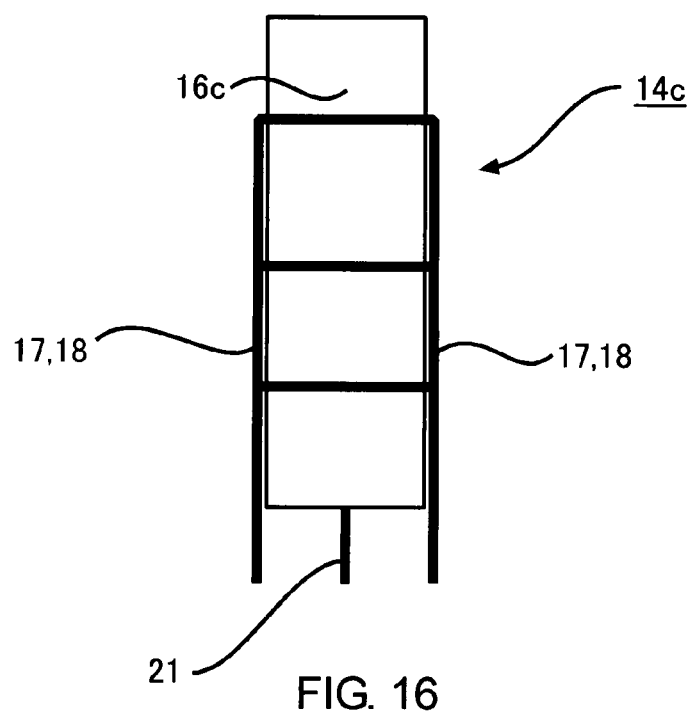
FIG. 16 is a side view showing the inductance device of FIG. 15.
Figure 17:
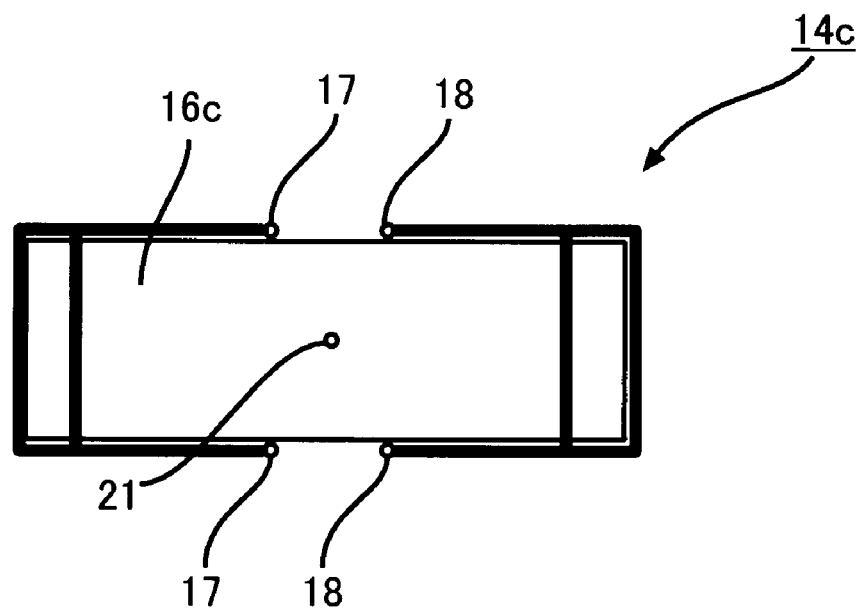
FIG. 17 is a bottom view showing the inductance device of FIG. 15.

As shown in FIGS. 15 to 17, the ground terminal 21 is provided at the position equally apart from the leading portions of the insulated conductive wires 17 and 18. However, as described in the first embodiment with reference to FIG. 4, the inductance device 14c' may have two ground terminals separately extending from the conductor 24a. In that case, a distance between the ground terminals may be longer than the distance between the insulated conductive wires 17 or 18.

Sixth Embodiment

Referring to FIGS. 19 to 22, a sixth embodiment of the present invention is a modified example of the fifth embodiment. Therefore, in FIGS. 19 to 22, the same reference numbers are given to the structures same as those illustrated in FIGS. 15 to 18 and the description therefore will be omitted.

An inductance device 14c' of this embodiment comprises the magnetic core 15c, two conductors 24b and 24b', a dielectric member 16c' and a pair of the ground terminals 21. Each of the conductors 24b and 24b' is provided with the ground terminal 21.

Figure 22:
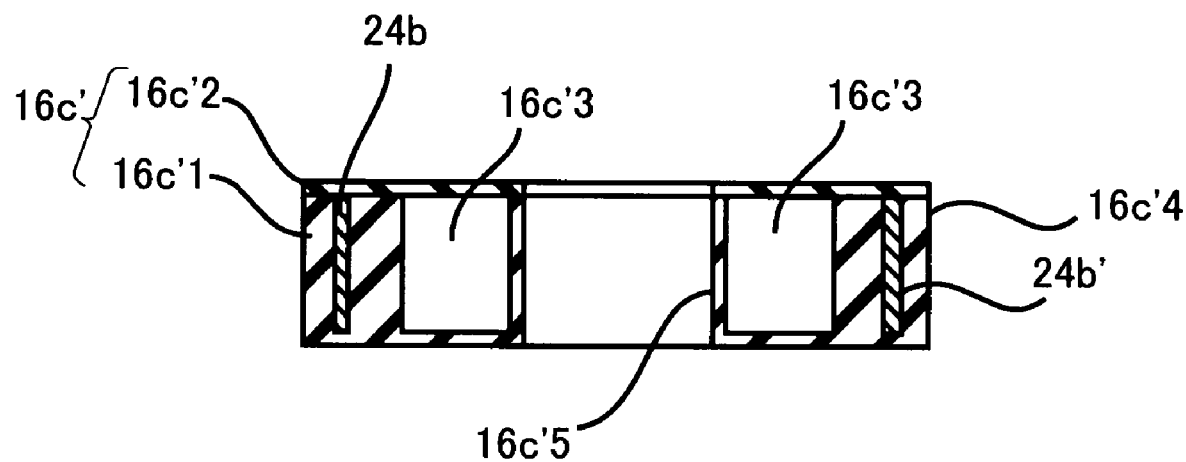
FIG. 22 is a cross-sectional view showing a dielectric member and a conductor included in the inductance device of FIG. 19.
Figure 23:
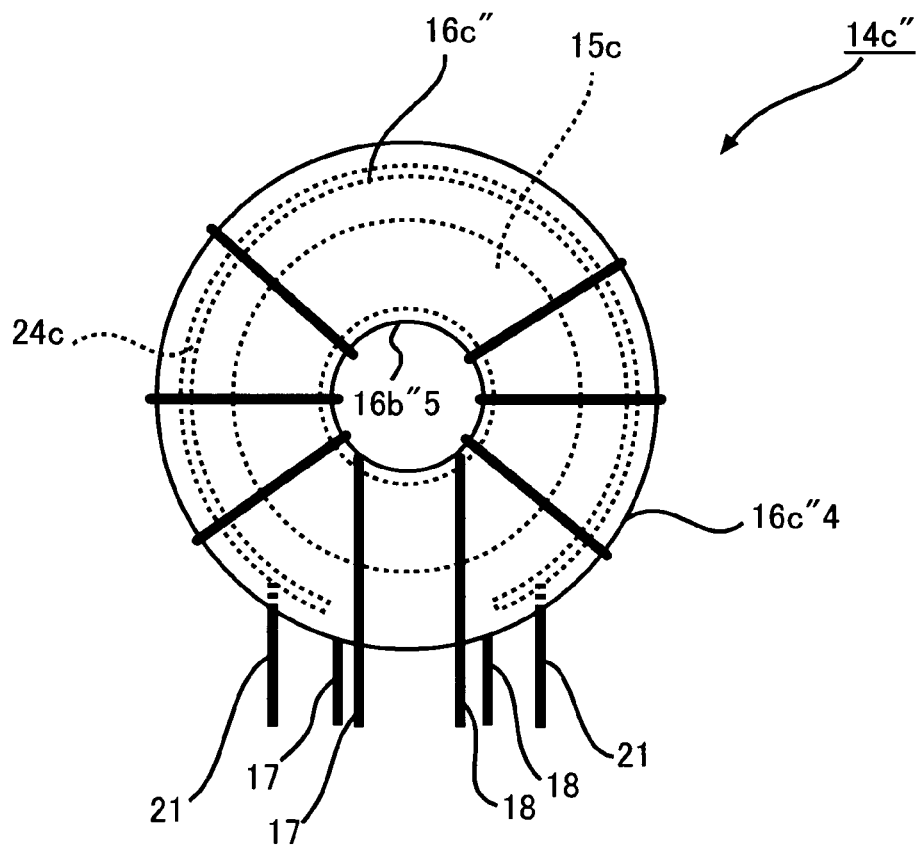
FIG. 23 is a plan view showing an inductance device in accordance with a seventh embodiment of the present invention.
Figure 24:
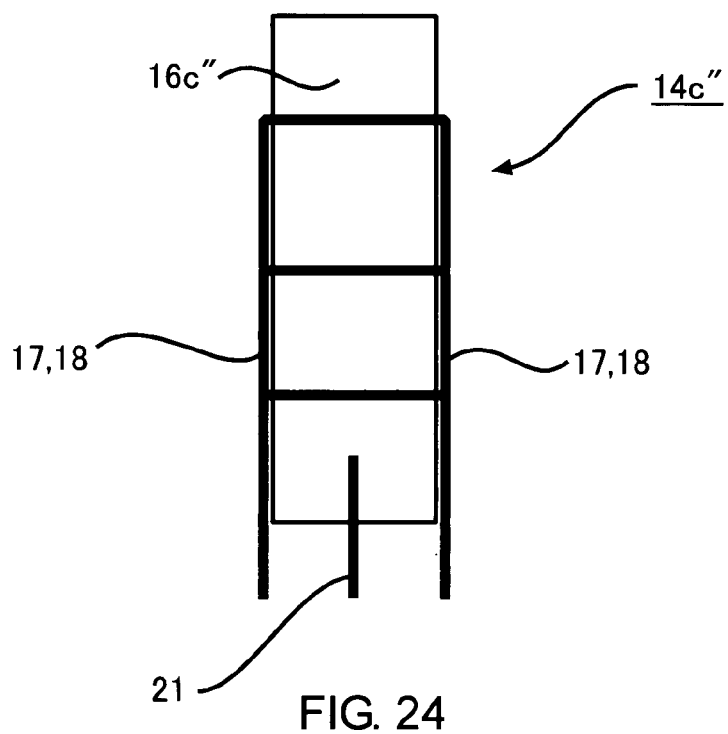
FIG. 24 is a side view showing the inductance device of FIG. 23.
Figure 25:
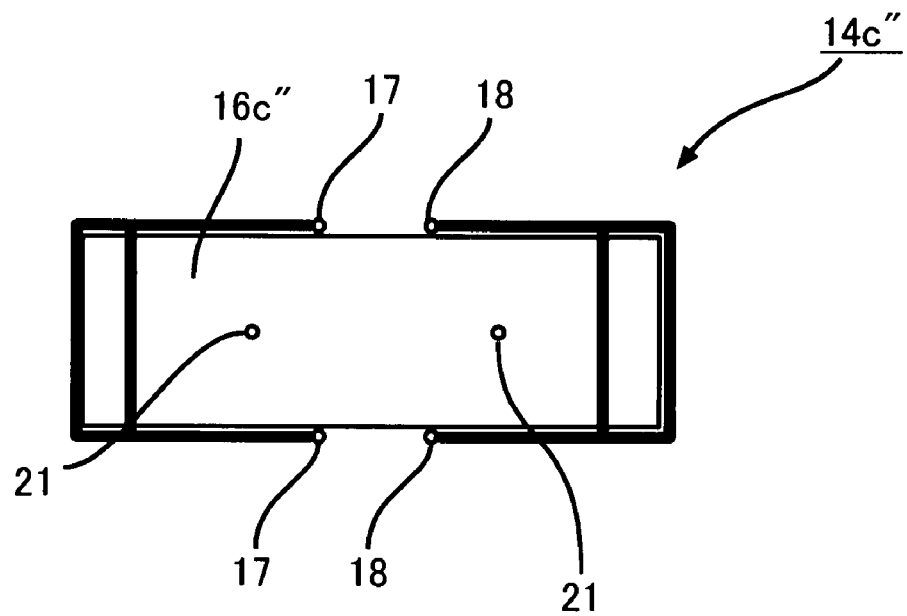
FIG. 25 is a bottom view showing the inductance device of FIG. 23.

As shown in FIG. 22, the dielectric member 16c' of this embodiment comprises a base portion 16c'1 and a lid portion 16c'2 covering the base portion 16c'1. In the base portion, an accommodation portion 16c'3 is formed. The base portion 16c'1 has an outer ring-shaped surface 16c'4 and an inner ring-shaped surface 16c'5. In this embodiment, the accommodation portion 16c'3 is a recessed portion having a toroidal shape and is provided near the inner ring-shaped surface 16c'5. The dielectric member 16c' holds the magnetic core 15c in the accommodation portion 16c'3. The conductors 24b and 24b' are embedded in the dielectric member 16c' and are positioned between the magnetic core 15c and the outer ring-shaped surface 16c'4.

Seventh Embodiment

Referring to FIGS. 23 to 26, a seventh embodiment of the present invention is a modified example of the fifth embodiment. Therefore, in FIGS. 23 to 26, the same reference numbers are given to the structures same as those illustrated in FIGS. 15 to 18 and the description therefore will be omitted.

An inductance device 14c" of this embodiment comprises the magnetic core 15c, a conductor 24c, a dielectric member 16c", and a pair of the ground terminals 21. The conductor 24c is a thin film conductor and has a partially cut-off C shape. The opening of the conductor 24c is positioned near the leading portions of the insulated conductive wires 17 and 18.

Figure 26:
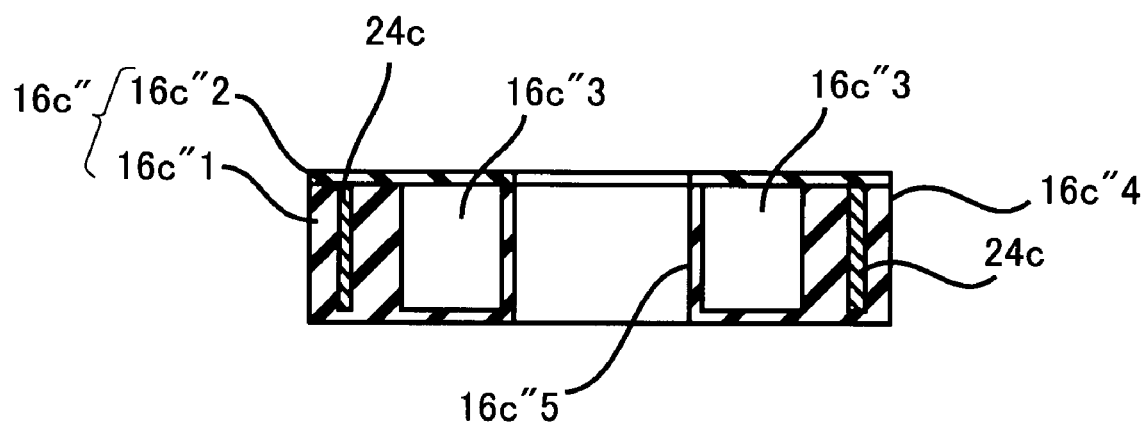
FIG. 26 is a cross-sectional view showing a dielectric member and a conductor included in the inductance device of FIG. 23.
Figure 27:
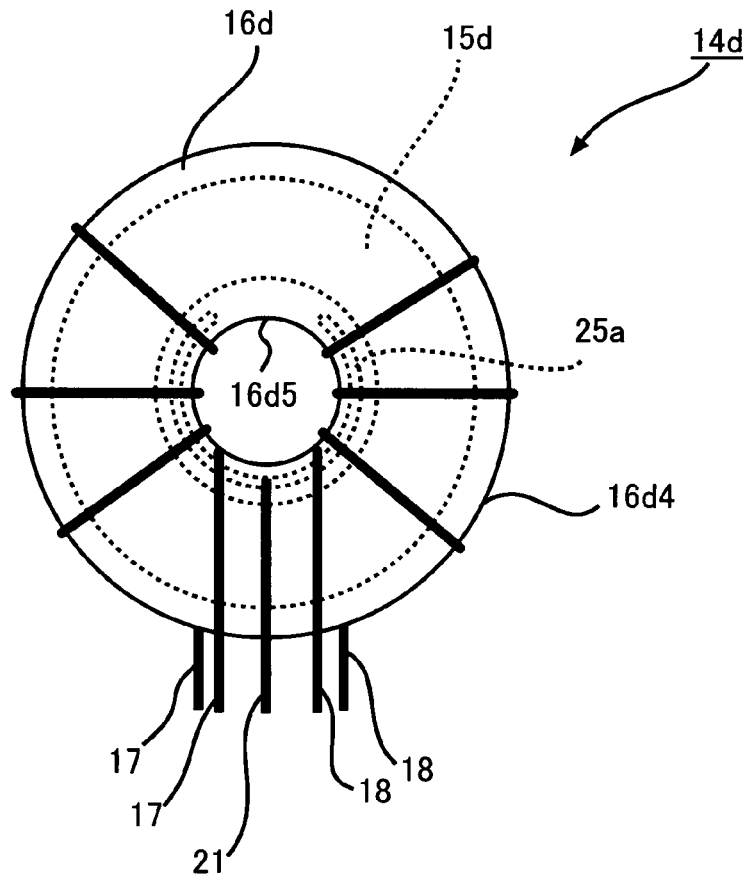
FIG. 27 is a plan view showing an inductance device in accordance with an eighth embodiment of the present invention.
Figure 28:
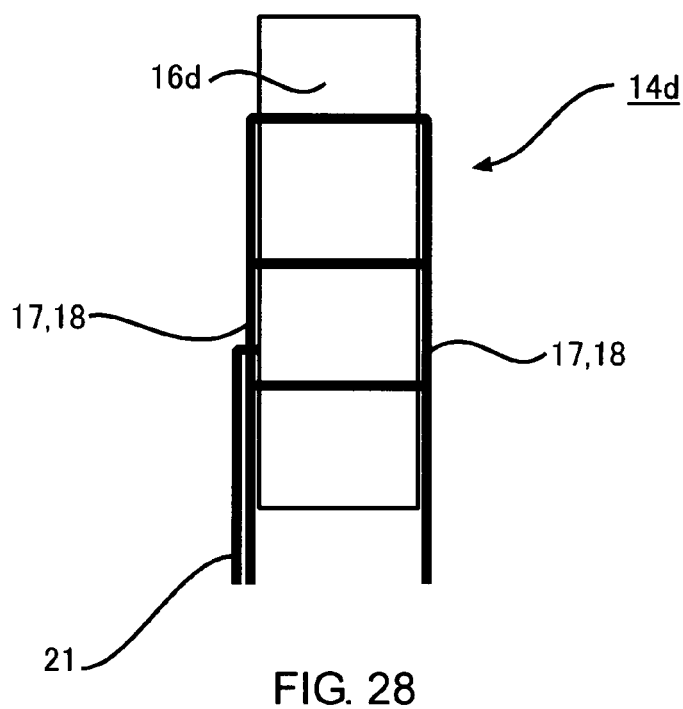
FIG. 28 is a side view showing the inductance device of FIG. 27.
Figure 29:
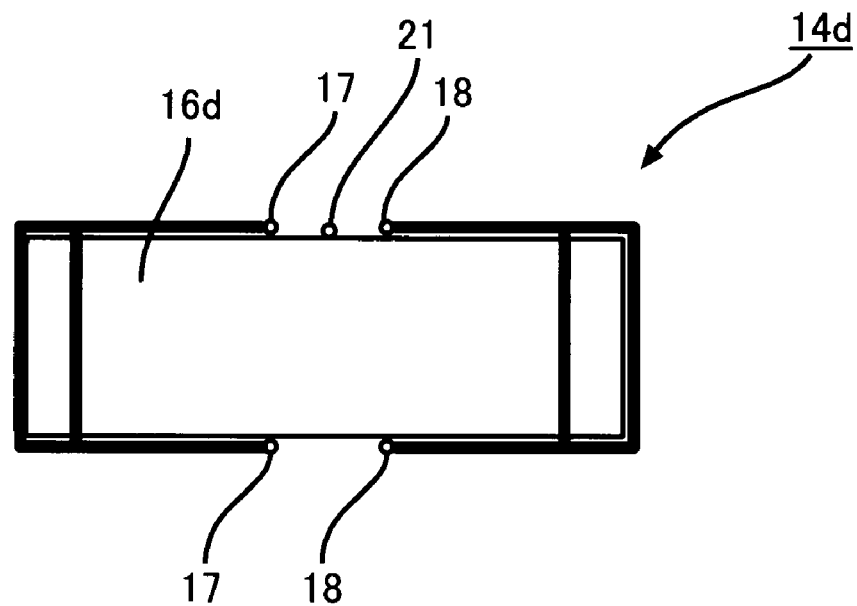
FIG. 29 is a bottom view showing the inductance device of FIG. 27.

As shown in FIG. 26, the dielectric member 16c" of this embodiment comprises a base portion 16c"1 and a lid portion 16c"2 covering the base portion 16c"1. In the base portion 16c"1, an accommodation portion 16c"3 is formed. The base portion 16c"1 has an outer ring-shaped surface 16c"4, and an inner ring-shaped surface 16c"5. In this embodiment, the accommodation portion 16c"3 is a recessed portion having a toroidal shape and is provided near the inner ring-shaped surface 16c"5. The dielectric member 16c" holds the magnetic core 15c in the accommodation portion 16c"3. The conductor 24c is embedded in the dielectric member 16c" and is positioned between the magnetic core 15c and the outer ring-shaped surface 16c"4.

Eighth Embodiment

Referring to FIGS. 27 to 30, an eighth embodiment of the present invention is a modified example of the fifth embodiment. Therefore, in FIGS. 27 to 30, the same reference numbers are given to the structures same as those illustrated in FIGS. 15 to 18 and the description therefore will be omitted.

The inductance device 14d in this embodiment comprises a magnetic core 15d, a conductor 25a, a dielectric member 16d, the ground terminal 21 connected to the conductor 25a, and the coils made of turns of insulated conductive wires 17 and 18.

The magnetic core 15d has a toroidal shape. The conductor 25a is a thin film conductor and has a partially cut-off C shape. The dielectric member 16d is a molded insulator and has a toroidal shape. The insulated conductive wires 17 and 18 are wound on the dielectric member 16d. The ground terminal 21 is pulled out from the conductor 25a via a through-hole formed in the dielectric member 16d.

A part of the dielectric member 16d is disposed between the conductor 25a and the coils so that the dielectric member 16d, the conductor 25a and the coils constitute a capacitor.

Another part of the dielectric member 16d is disposed between the magnetic core 15d and the conductor 25a so that the conductor 25a is insulated from the magnetic core 15d.

Figure 30:
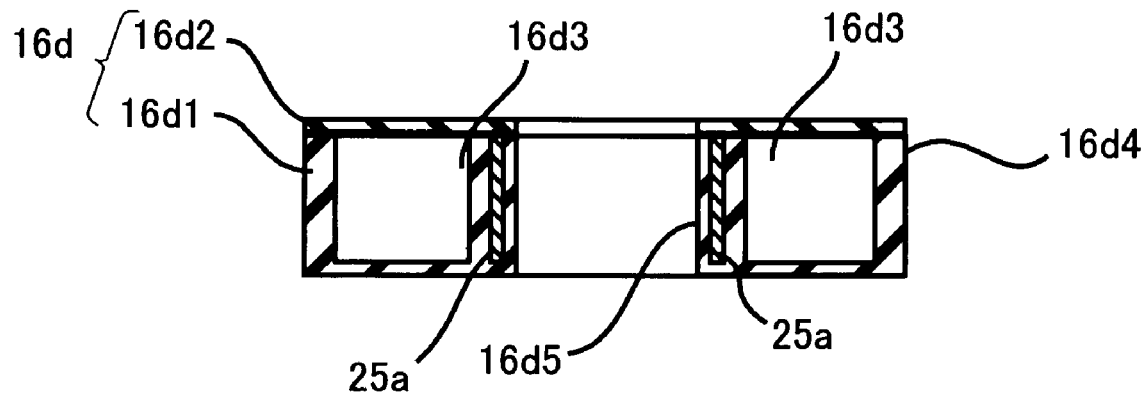
FIG. 30 is a cross-sectional view showing a dielectric member and a conductor included in the inductance device of FIG. 27.

As shown in FIG. 30, the dielectric member 16d of this embodiment comprises a base portion 16d1 and a lid portion 16d2 covering the base portion 16d1. In the base portion 16d1, an accommodation portion 16d3 is formed. The base portion 16d1 has an outer ring-shaped surface 16d4 and an inner ring-shaped surface 16d5. In this embodiment, the accommodation portion 16d3 is a recessed portion having a toroidal shape and is provided near the outer ring-shaped surface 16d4. The dielectric member 16d holds the magnetic core 15d in the accommodation portion 16d3. The conductor 25a is embedded in the dielectric member 16d by a molding process and is positioned between the magnetic core 15d and the inner ring-shaped surface 16c5. The conductor 25a is positioned near the inner ring-shaped surface 16c5.

Ninth Embodiment

Figure 31:
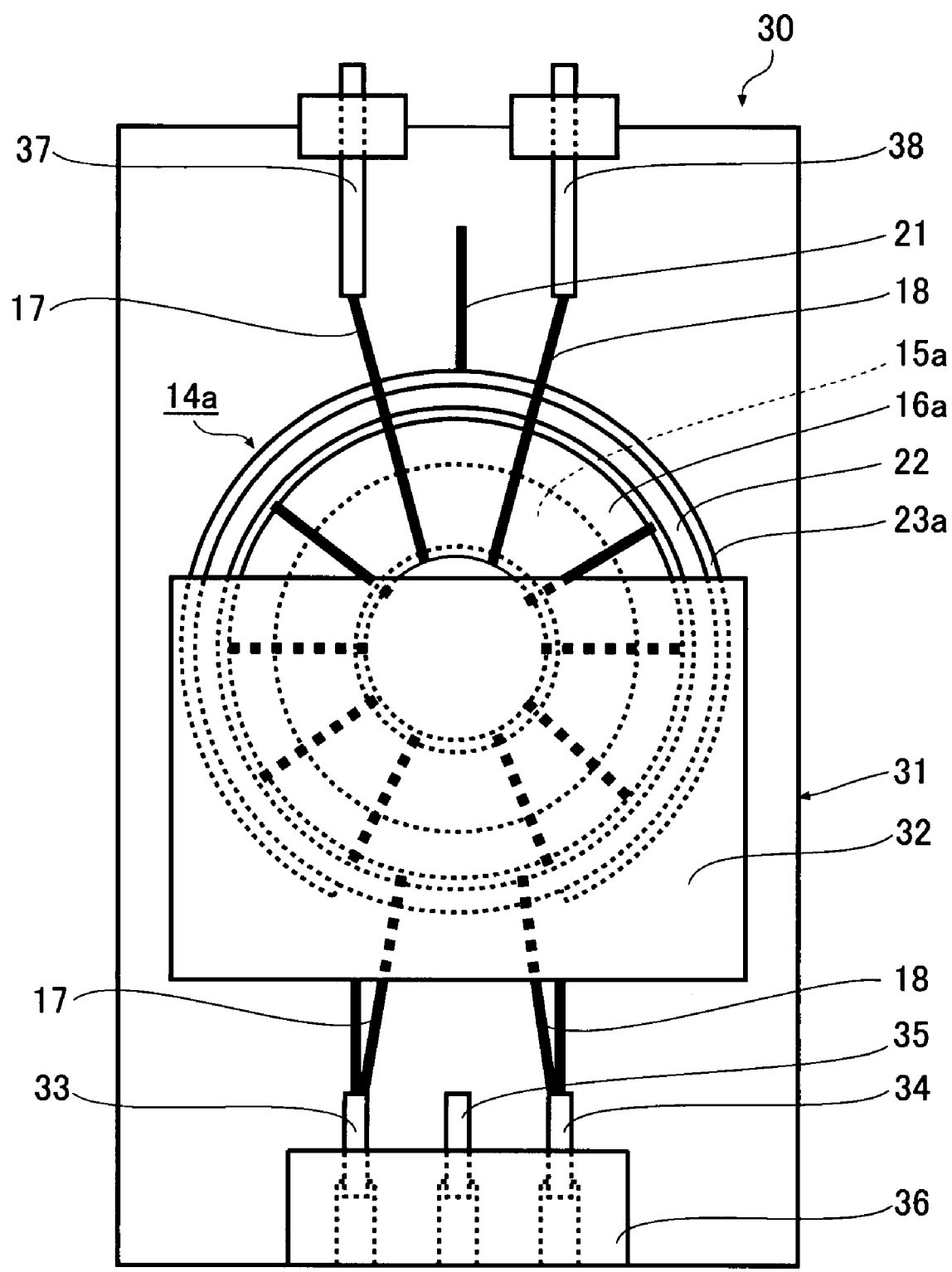
FIG. 31 is a plan view showing a noise filter in accordance with a ninth embodiment of the present invention.
Figure 32:
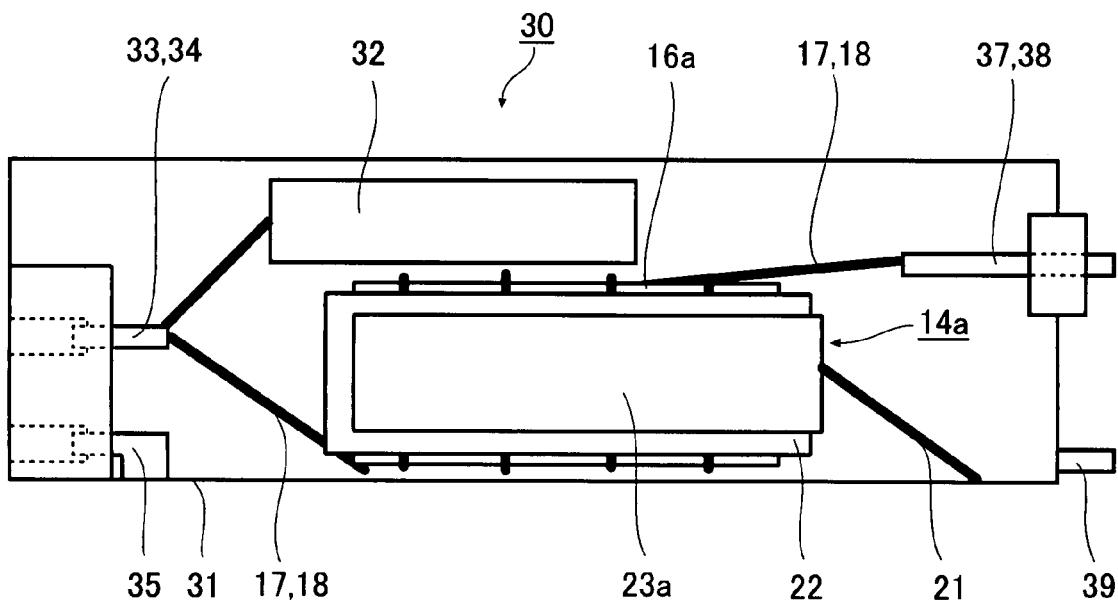
FIG. 32 is a side view showing the noise filter of FIG. 31.

Referring to FIGS. 31 and 32, a ninth embodiment of the present invention is a noise filter 30 comprising the inductance device 14a of the first embodiment. Therefore, in FIGS. 31 and 32, the same reference numbers are given to the structures same as those of the inductance device 14a of the first embodiment and the description therefore will be omitted.

As shown in FIG. 31, the noise filter 30 comprises the inductance device 14a, a metal casing 31, and a capacitor 32 for removing a common mode noise.

The metal casing 31 accommodates the inductance device 14a. The metal casing 31 comprises a socket 36, output terminals 37 and 38, and a ground terminal 39. The socket 36 comprises input terminals 33 and 34 and a ground terminal 35. The metal casing 31 is electrically coupled to the ground terminal 35.

In this embodiment, the insulated conductive wire 17 is connected to the input terminal 33 and the output terminal 37. Similarly, the insulated conductive wire 18 is connected to the input terminal 34 and the output terminal 38. The ground terminal 21 is electrically coupled to the metal casing 31.

The capacitor 32 is electrically coupled between the first input terminal 33 and the second input terminal 34. Similarly, another capacitor may be electrically coupled between the first output terminal 37 and the second output terminal 38.

The metal casing 31 is grounded via the ground terminal 39.

Figure 33:
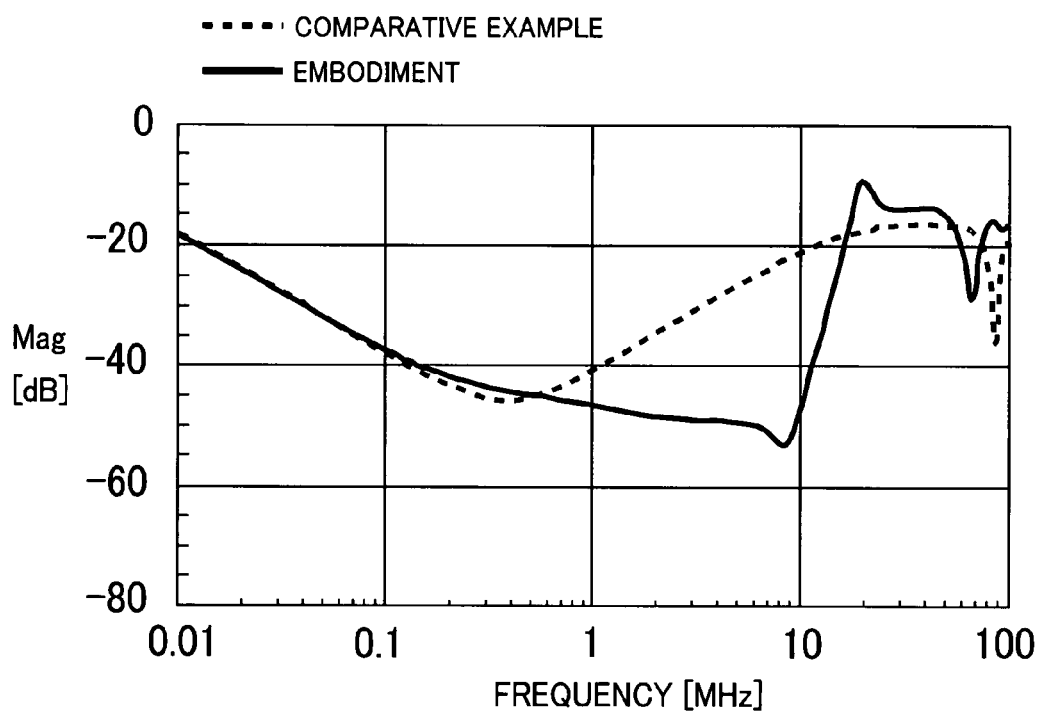
FIG. 33 is a graph showing a high-frequency characteristic of the noise filter of FIG. 31.

Referring to FIG. 33, the noise filter 30 of this embodiment has an excellent attenuating characteristic in a wide frequency band from 10 kHz to 20 MHz as compared with the noise filter having the conventional inductance device.

Instead of the inductance device 14a according to the first embodiment, one of the inductance devices of the second to the eighth embodiments may be used in the noise filter 30. Although each of the above-described inductance devices comprises the magnetic core having the toroidal shape, this invention is not limited thereto but may be applicable to magnetic cores of various shapes. For example, a stick-shape magnetic core may be used; the magnetic core is held by an insulator bobbin, and at least one insulated conductive wire is wound around the insulator bobbin. A conductor and a dielectric member are combined therewith so that an inductance device is obtained.

The present application is based on Japanese patent applications of JP2006-276882 filed before the Japan Patent Office on Oct. 10, 2006 and JP2007-192344 filed before the Japan Patent Office on Jul. 24, 2007, all contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An inductance device comprising:
   a magnetic core;
   a coil made of turns of insulated conductive wire;
   a conductor insulated from the magnetic core, the conductor being distinct from the coil;
   a dielectric member disposed between the conductor and the coil so that the dielectric member, the conductor and the coil constitute a capacitor; and
   a toroidal insulator;
   wherein:
   the magnetic core is a toroidal core;
   the toroidal insulator encloses the magnetic core;
   the insulated conductive wire is wound on the toroidal insulator; and
   the dielectric member is disposed on the coil so that at least one part of the coil is positioned between the dielectric member and the insulator.

2. The inductance device according to claim 1, wherein the coil and the dielectric member are disposed between the magnetic core and the conductor.

3. The inductance device according to claim 1, wherein the dielectric member comprises an encirclement member encircling the coil.

4. The inductance device according to claim 1, wherein the dielectric member comprises an insulator sheet or tape, the insulator sheet or tape has two surfaces, and at least one of the two surfaces is formed with an adhesive layer.

5. The inductance device according to claim 1, wherein the dielectric member comprises a silicone sheet or a fluoride resin sheet.

6. The inductance device according to claim 1, wherein the conductor is a thin film conductor.

7. The inductance device according to claim 6, wherein the thin film conductor is obtained by exposing the dielectric member to a metal plating process, a metal deposition process or a metal sputtering process, or by applying a conductive paint coating to the dielectric member.

8. The inductance device according to claim 6, wherein the thin film conductor is stuck on the dielectric member.

9. The inductance device according to claim 1, further comprising a ground terminal connected to the conductor.

10. The inductance device according to claim 1, wherein the magnetic core has magnetic permeability of 10000 or more.

11. A filter device comprising the inductance device according to claim 1.

12. A noise filter comprising:
the inductance device according to claim 1;
a metal casing;
an input terminal; and
an output terminal;
wherein the metal casing accommodates the inductance device and holds the input terminal and the output terminal; and
wherein the input terminal and the output terminal are connected to the insulated conductive wire of the coil.

13. The noise filter according to claim 12, wherein:
the insulated conductive wire comprises first and second wires;
the input terminal comprises first and second input terminals;
the output terminal comprises first and second output terminals;
the first wire is connected to the first input terminal and the first output terminal; and
the second wire is connected to the second input terminal and the second output terminal.

14. The noise filter according to claim 13, further comprising a capacitor electrically coupled to the first input terminal and the second input terminal.

15. The noise filter according to claim 13, further comprising a capacitor electrically coupled to the first output terminal and the second output terminal.

16. The noise filter according to claim 13, wherein the inductance device further comprises a ground terminal connected to the conductor, the ground terminal being connected to the metal casing.

17. An inductance device comprising:
a magnetic core;
a coil made of turns of insulated conductive wire;
a conductor insulated from the magnetic core, the conductor being distinct from the coil; and
a dielectric member disposed between the conductor and the coil so that the dielectric member, the conductor and the coil constitute a capacitor;
wherein the coil surrounds the magnetic core, the conductor and the dielectric member.

18. The inductance device according to claim 17, further comprising a toroidal insulator,
wherein:
the magnetic core is a toroidal core;
the toroidal insulator encloses the magnetic core;
the conductor is disposed on the toroidal insulator; and
the dielectric member is disposed on the conductor so that the conductor is positioned between the dielectric member and the toroidal insulator.

19. An inductance device comprising:
a magnetic core;
a coil made of turns of insulated conductive wire;
a conductor insulated from the magnetic core, the conductor being distinct from the coil; and
a dielectric member disposed between the conductor and the coil so that the dielectric member, the conductor and the coil constitute a capacitor;
wherein the dielectric member comprises a silicone sheet or a fluoride resin sheet.

20. An inductance device comprising:
a magnetic core;
a coil made of turns of insulated conductive wire;
a conductor insulated from the magnetic core, the conductor being distinct from the coil; and
a dielectric member disposed between the conductor and the coil so that the dielectric member, the conductor and the coil constitute a capacitor;
wherein the conductor is a thin film conductor.

21. The inductance device according to claim 20, wherein the thin film conductor is obtained by exposing the dielectric member to a metal plating process, a metal deposition process or a metal sputtering process, or by applying a conductive paint coating to the dielectric member.

22. The inductance device according to claim 20, wherein the thin film conductor is stuck on the dielectric member.

23. An inductance device comprising:
a magnetic core;
a coil made of turns of insulated conductive wire;
a conductor insulated from the magnetic core, the conductor being distinct from the coil; and
a dielectric member disposed between the conductor and the coil so that the dielectric member, the conductor and the coil constitute a capacitor;
wherein the dielectric member is a molded insulator, the molded insulator holds the magnetic core and the conductor, and the insulated conductive wire is wound on the dielectric member.

24. The inductance device according to claim 23, wherein the dielectric member contains the conductor and is formed with an accommodation portion, the magnetic core being accommodated in the accommodation portion.

25. The inductance device according to claim 23, wherein:
the magnetic core is a toroidal core; and
the dielectric member has a ring-like or annular shape.

26. The inductance device according to claim 25, wherein the dielectric member has an outer ring-shaped surface, the conductor being positioned between the magnetic core and the outer ring-shaped surface.

27. The inductance device according to claim 25, wherein the dielectric member has an inner ring-shaped surface, the conductor being positioned between the magnetic core and the inner ring-shaped surface.

28. An inductance device comprising:
a magnetic core;
a coil made of turns of insulated conductive wire;
a conductor insulated from the magnetic core, the conductor being distinct from the coil;
a dielectric member disposed between the conductor and the coil so that the dielectric member, the conductor and the coil constitute a capacitor; and
a ground terminal connected to the conductor.

29. An inductance device comprising:
a magnetic core;

a coil made of turns of insulated conductive wire;

a conductor insulated from the magnetic core, the conductor being distinct from the coil; and a dielectric member disposed between the conductor and the coil so that the dielectric member, the conductor and the coil constitute a capacitor;

wherein the magnetic core has magnetic permeability of 10000 or more.

30. A noise filter comprising:

an inductance device;

a metal casing;

an input terminal; and an output terminal;

wherein the metal casing accommodates the inductance device and holds the input terminal and the output terminal;

wherein the inductance device comprises:

a magnetic core;

a coil made of turns of insulated conductive wire;

a conductor insulated from the magnetic core, the conductor being distinct from the coil; and a dielectric member disposed between the conductor and the coil so that the dielectric member, the conductor and the coil constitute a capacitor; and wherein the input terminal and the output terminal of the noise filter are connected to the insulated conductive wire of the coil.

31. The noise filter according to claim 30, wherein:

the insulated conductive wire comprises first and second wires;

the input terminal comprises first and second input terminals;

the output terminal comprises first and second output terminals;

the first wire is connected to the first input terminal and the first output terminal; and the second wire is connected to the second input terminal and the second output terminal.

32. The noise filter according to claim 31, further comprising a capacitor electrically coupled to the first input terminal and the second input terminal.

33. The noise filter according to claim 31, further comprising a capacitor electrically coupled to the first output terminal and the second output terminal.

34. The noise filter according to claim 31, wherein the inductance device further comprises a ground terminal connected to the conductor, the ground terminal being connected to the metal casing.

* * * * *